(12) United States Patent
Bimberg et al.

(10) Patent No.: US 7,948,822 B2
(45) Date of Patent: May 24, 2011

(54) MEMORY CELL, AND METHOD FOR STORING DATA

(75) Inventors: Dieter Bimberg, Berlin (DE); Martin Geller, Berlin (DE); Andreas Marent, Berlin (DE)

(73) Assignee: Technische Universitat Berlin (DE)

( * ) Notice: Subject to any disclaimer, the term of this patent is extended or adjusted under 35 U.S.C. 154(b) by 158 days.

(21) Appl. No.: 12/518,223

(22) PCT Filed: Dec. 3, 2007

(86) PCT No.: PCT/DE2007/002182
§ 371 (c)(1),
(2), (4) Date: Jun. 8, 2009

(87) PCT Pub. No.: WO2008/067799
PCT Pub. Date: Jun. 12, 2008

(65) Prior Publication Data
US 2010/0080068 A1 Apr. 1, 2010

(30) Foreign Application Priority Data

Dec. 8, 2006 (DE) .......................... 10 2006 059 110

(51) Int. Cl.
*G11C 7/00* (2006.01)
(52) U.S. Cl. .................................. 365/225.6; 365/164
(58) Field of Classification Search .............. 365/225.6, 365/164, 174; 257/197, 198, 14, E29.168
See application file for complete search history.

(56) References Cited

U.S. PATENT DOCUMENTS

| | | |
|---|---|---|
| 3,387,286 A | 6/1968 | Dennard |
| 4,905,063 A | 2/1990 | Beltram et al. |
| 5,447,873 A | 9/1995 | Randall et al. |

(Continued)

FOREIGN PATENT DOCUMENTS

DE 3737572 A1 5/1989

(Continued)

OTHER PUBLICATIONS

Balocco et al., Room-Temperature Operations of Memory Devices Based on Self-Assembled InAs Quantum Dot Structures, Dec. 13, 2004, Applied Physics Letters, vol. 85, No. 24, pp. 5911-5913.

(Continued)

*Primary Examiner* — Vu A Le
(74) *Attorney, Agent, or Firm* — Brooks Kushman P.C.

(57) ABSTRACT

The invention relates, among other things, to a memory cell for storing at least one piece of bit data. Said memory cell comprises at least two electrical terminals and a semiconductor structure with a band curve (EL) that has at least one potential well. The charged state of the potential well with charge carries can be increased by applying a supply voltage (Us=Uspeis) to the two terminals, can be reduced by applying a discharge voltage (Us=Usperr), and can be maintained by applying a maintaining voltage (Us=Ubei), the respective charged state of the potential well defining the piece of bit data of the memory cell. According to the invention, the semiconductor structure has a space charge region (Wn) while the potential well is formed by a semiconductor heterostructure. The semiconductor heterostructure and the space charge region are spatially arranged relative to one another in such a way that the semiconductor heterostructure is located within the space charge region when the maintaining voltage is applied, at the edge of or outside the space charge region when the supply voltage is applied, and within the space charge region when the discharge voltage is applied.

20 Claims, 15 Drawing Sheets

U.S. PATENT DOCUMENTS

Figure 1:
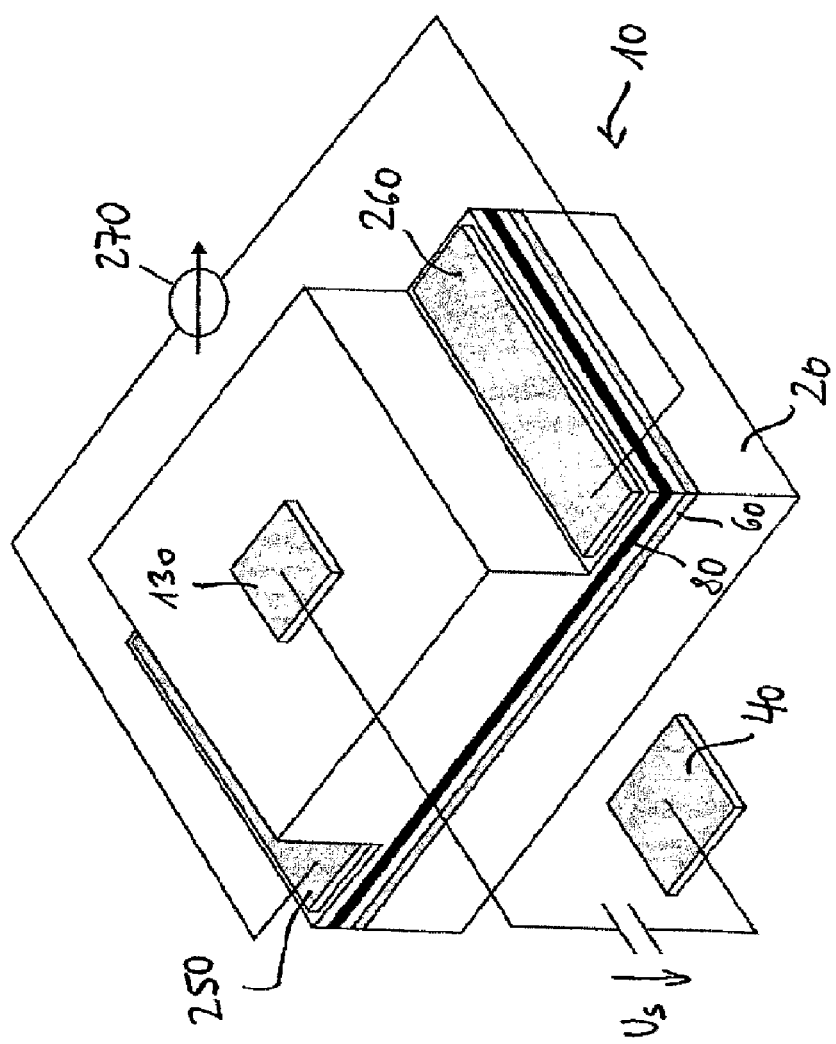

| | | | |
|---|---|---|---|
| 5,614,435 | A | 3/1997 | Petroff et al. |
| 5,798,539 | A * | 8/1998 | Jorke .......................... 257/197 |
| 5,923,046 | A | 7/1999 | Tezuka et al. |
| 6,054,349 | A | 4/2000 | Nakajima et al. |
| 6,118,686 | A | 9/2000 | Taira et al. |
| 6,211,531 | B1 | 4/2001 | Nakazato et al. |
| 6,524,883 | B2 | 2/2003 | Kim |
| 6,597,036 | B1 | 7/2003 | Lee et al. |
| 6,753,273 | B2 | 6/2004 | Holonyak, Jr. et al. |
| 2003/0153151 | A1 | 8/2003 | Choi et al. |

FOREIGN PATENT DOCUMENTS

| | | |
|---|---|---|
| EP | 0535293 A1 | 4/1993 |
| GB | 2341722 A | 3/2000 |
| JP | 2005203601 A | 7/2005 |
| WO | 03/049195 A1 | 6/2003 |

OTHER PUBLICATIONS

Bimberg et al., Quantum Dot Heterostructures, 1998, Wiley, pp. 1-6.

Dennard, Evolution of the MOSFET Dynamic RAM—A Personal View, Nov. 1984, IEEE Transactions on Electron Devices, vol. ED-31, No. 11, pp. 1549-1555.

Geller et al., 450 meB Hole Localization in GaSb/GaAs Quantum Dots, Apr. 21, 2003, Applied Physics Letters, vol. 82, No. 16, pp. 2706-2708.

Geller et al., Hole Capture Into Self-Organized InGaAs Quantum Dots, Dec. 4, 2006, Applied Physics Letters, vol. 89, No. 23, 232105.

Geller et al., Tunneling Emission From Self-Organized In(Ga)As/GaAs Quantum Dots Observed Via Time-Resolved Capacitance Measurements, May 15, 2006, Physical Review B: Condensed Matter and Materials Physics, vol. 73, No. 20, 205331.

Geppert, The New Indelible Memories: It's a Three-Way Race in the Multibillion-Dollar Memory Sweepstakes, Mar. 2003, IEEE Spectrum, pp. 49-54.

Intel, Evolution of Parallel Computing, Intel Platforms, Oct. 26, 2006 archive, retreived Jul. 9, 2009 from http://web.archive.org/web/20061017175851/http://www.intel.com/platforms/parallel.htm.

Kapteyn et al., Hole and Electron Emission From InAs Quantum Dots, Mar. 20, 2000, Applied Physics Letters, vol. 76, No. 12, pp. 1573-1575.

Kapteyn et al., Many-Particle Effects in Ge Quantum Dots Investigated by Time-Resolved Capacitance Spectroscopy, Dec. 18, 2000, Applied Physics Letters, vol. 77, No. 25, pp. 4169-4171.

Kapteyn et al., Electron Escape From InAs Quantum Dots, Nov. 15, 1999, Physical Review B, vol. 60, No. 20, pp. 14 265-14 268.

Katayama, Trends in Semiconductor Memories, Nov./Dec. 1997, IEEE Micro, vol. 17, pp. 10-17.

Koike et al., Charge Storage Effect of the Vertically Stacked InAs Nanodots Embedded in Al(0.5)Ga(0.5)As Matrix, 2001, International Conference on Indium Phosphide and Related Materials, Conference Proceedings, pp. 39-42.

Lin et al., Carrier Emission From the Electronic States of Self-Assembled Indium Arsenide Quantum Dots, 2006, Materials Science and Engineering C, vol. 26, pp. 760-765.

Marent et al., Carrier Storage Time of Milliseconds at Room Temperature in Self-Organized Quantum Dots, 2006, Applied Physics Letters, vol. 89, pp. 072103-1-072103-3.

Medeiros-Ribeiro et al., Electron Hole Energy Levels in InAs Self-Assembled Quantum Dots, Apr. 3, 1995, Applied Physics Letters, vol. 66, No. 14, pp. 1767-1769.

Muller et al., Ultrafast Intraband Spectroscopy of Electron Capture and Relaxation in InAs/GaAs Quantum Dots, Oct. 27, 2003, Applied Physics Letters, vol. 83, No. 17, pp. 3572-3574.

International Technology Roadmap for Semiconductors, 2005 Edition, Executive Summary.

Spansion Announces MirrorBit(R) Quad Technology—World's First 4-Bit-Per Cell Flash Memory, Sep. 25, 2006, http://investor.spansion.com/releasedetail.cfm?ReleaseID=212148.

Sze, Evolution of Nonvolatile Semiconductor Memory: From Floating-Gate Concept to Single-Electron Memory Cell, 1999, Future Trends in Microelectronics, eds. S. Luryi, J. Xu, and A. Zaslavsky, pp. 291-303.

Waser, High-Permittivity Materials for DRAMs, 2003, Microelectronics and Information Technology, pp. 541-543.

International Search Report for PCT/DE2007/002182.

* cited by examiner

MEMORY CELL, AND METHOD FOR STORING DATA

The invention relates to a memory cell for storing at least one item of bit information, wherein the memory cell comprises a semiconductor structure with a band profile having at least one potential well and comprises at least two electrical connections, wherein the charged state of the potential well with charge carriers can be increased by applying an electrical supply voltage to the two connections, can be reduced by applying a discharge voltage, and can be maintained by applying a maintaining voltage, and wherein the respective charged state of the potential well defines the item of bit information of the memory cell.

The two most important commercially available semiconductor memory cells nowadays are DRAM and flash memory cells.

DRAM memory cells, which are employed for example as main memory in PCs, store the information as charge in a capacitor (R. Waser, Microelectronics and Information Technology, Wiley-VCH, Berlin, 2003). The advantages of the DRAM memory cells reside in a fast access time in the region of less than 20 nanoseconds and a high durability of $>10^{15}$ writing and erasing cycles. One disadvantage of the DRAM memory cells is a relatively short storage time of only a few tens of milliseconds.

In the case of flash memory cells, which are used e.g. in memory sticks, digital cameras or mobile phones and form memory cells of the generic type, use is made of a MOSFET structure with an additional floating gate as memory element (L. Geppert, The new indelible memories, IEEE Spectrum, 49-54 (2003); S. M. Sze, Evolution of Nonvolatile Semiconductor Memory: From Floating-Gate Concept to Single-Electron Memory Cell, in Future Trends in Microelectronics, edited by S. Luryi, J. Xu, and A. Zaslaysky, page 291, John Wiley & Sons, Inc., 1999).

Figure 15:
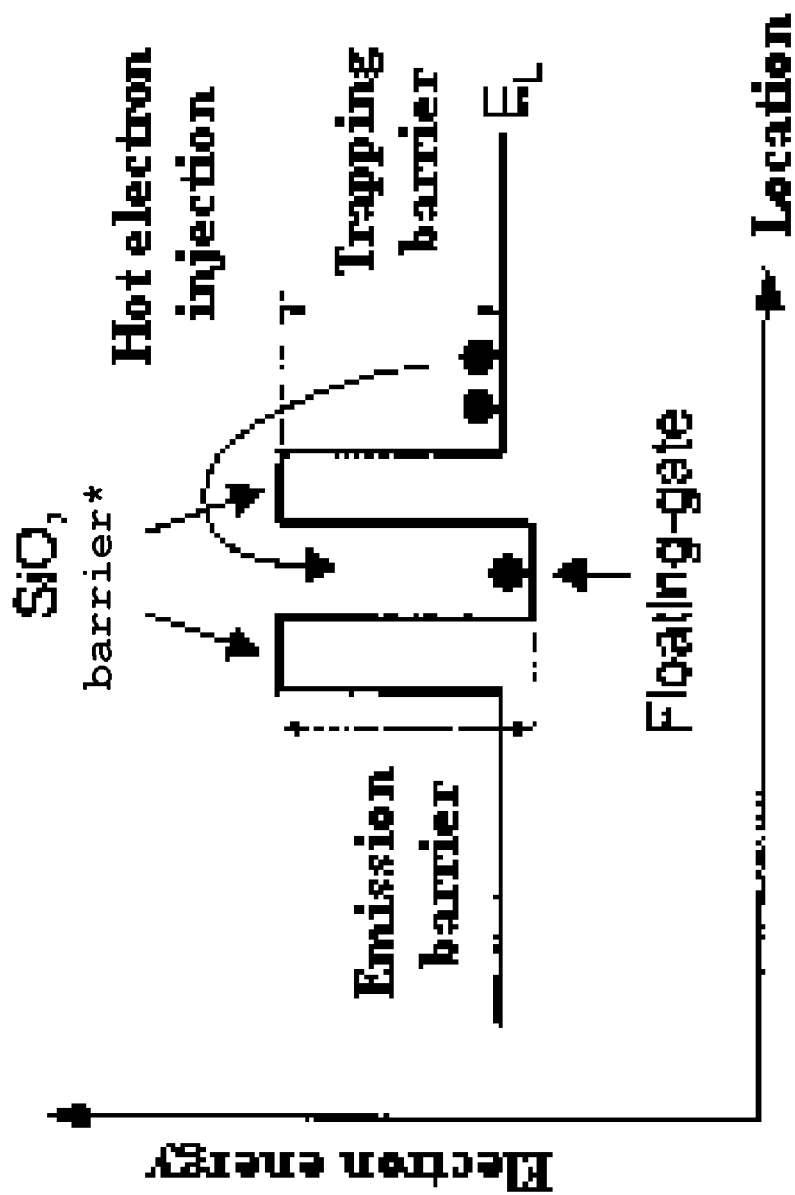

The band profile of a previously known flash memory cell is shown by way of example in FIG. 15. $SiO_2$ barriers enclosing a so-called floating gate, in which charge can be stored, are discernible. The $SiO_2$ barriers of the flash memory cell enable storage times >10 years. However, the $SiO_2$ barriers also lead to disadvantages, namely to a slow writing time of the order of magnitude of microseconds and to just a low durability of only about a million erasing and writing cycles. In a CHE flash cell (CHE=channel hot electron), the writing process is effected by means of injection of hot charge carriers (hot electron injection), in the case of which the charge carriers are accelerated by application of a voltage to such a great extent that they can be brought into the floating gate via one of the two $SiO_2$ barriers. The hot charge carriers destroy the barrier owing to their high kinetic energy, whereby the durability is limited, and pass into the floating gate only with a low probability, whereby the writing process is very slow.

Accordingly, the invention is based on the object of specifying a memory cell which can be written to relatively rapidly and nevertheless has a long storage time.

This object is achieved according to the invention by means of a memory cell having the features of claim 1. Advantageous configurations of the invention are specified in dependent claims.

Accordingly, the invention provides for the memory cell to have a semiconductor structure having a space charge zone and for the potential well to be formed by a semiconductor heterostructure, wherein the semiconductor heterostructure and the space charge zone are spatially arranged relative to one another in such a way that the semiconductor heterostructure is situated within the space charge zone when the maintaining voltage is present, at the edge of or outside the space charge zone when the supply voltage is present, and within the space charge zone when the discharge voltage is present.

One essential advantage of the memory cell according to the invention can be seen in the fact that this memory cell can be written to rapidly and also has a very long storage time on account of the relative arrangement provided according to the invention between a space charge zone and a semiconductor heterostructure and thus on account of the interplay between the space charge zone and semiconductor heterostructure. The access time, that is to say the writing or reading times, are in the nanoseconds range, and at the same time storage times of several years are possible.

The concept according to the invention consists in the fact that a semiconductor heterostructure can be filled with charge carriers very rapidly and can also be freed of said charge carriers again very rapidly, such that the high access speed mentioned is achieved.

The long storage time is achieved according to the invention by virtue of the fact that, for the storage mode, that is to say for the state of maintaining the stored charge, the space charge zone is extended to the semiconductor heterostructure, such that the charge carriers trapped in the semiconductor heterostructure cannot escape from the latter; at the same time—to be precise on account of the depletion of charge carriers within the space charge zone—no other charge carriers can fall into the potential well of the semiconductor heterostructure either, such that the charged state of the potential well is preserved. This ensures for example both reliable storage of a logic one (for example defined by a filled potential well) and reliable storage of a logic zero (for example defined by an empty potential well).

In other words, the inventive concept thus consists in combining a space charge zone with a semiconductor heterostructure in order to store items of bit information.

The semiconductor heterostructure preferably has at least one nanostructure. Nanostructures are understood here to mean for example low-dimensional semiconductor structures whose extent in one or more spatial directions is restricted such that the extent in said spatial direction is of the order of magnitude of the "de Broglie" wavelength of the charge carrier under consideration (electron or hole). Nanostructures of this type can be formed by quantum films, quantum wires or quantum dots, as are known for example from the publication "Quantum Dot Heterostructures" (D. Bimberg, M. Grundmann, and N. N. Ledentsov, John Wiley & Sons, Chichester, 1998).

The allowed states of the nanostructures preferably lie at lower energy levels than those of the material surrounding them (e.g. matrix material). For the charge carriers bound or stored in such a nanostructure, in this case a potential barrier is present which the charge carriers can surmount only by taking up energy so as to pass into the conduction or valence band of the surrounding material. One essential advantage of the nanostructures is that only relatively few charge carriers are required for representing an information bit since the number of available occupation states within the potential well is very small in the case of nanostructures: in the ideal case, an information bit can be represented by just one or two charge carriers. Memory cells having nanostructures thus differ considerably from the previously known types of memory cells described in the introduction, in which a large number of charge carriers are required for storing an information bit and a relatively high energy consumption arises during the writing and erasing process: flash memory cells require approximately one thousand electrons, for example, while DRAM memory cells even need tens of thousands of charge carriers for an information bit.

The way in which the space charge zone is produced is moreover as desired, in principle: the space charge zone can be brought about particularly simply and thus advantageously, however, by a pn junction. As an alternative, the space charge zone can also be based on a Schottky contact, for example.

The memory cell is preferably configured in such a way that the charged state of the semiconductor heterostructure can be increased by applying a forward voltage to the connections. The charged state is preferably increased by relaxation of the charge carriers from a conduction or valence band edge of a doped semiconductor material that is indirectly or directly adjacent to the semiconductor heterostructure, namely because a relaxation process physically proceeds very rapidly.

The band profile is embodied in the region of the semiconductor heterostructure for example in such a way that the charged state of the semiconductor heterostructure can be reduced by applying a reverse voltage. The reduction of the charged state can be based on a tunnel effect, for example.

The semiconductor structure can comprise for example a III/V material combination, a II/VI material combination or a IV/IV material combination.

By way of example, a read-out layer containing a two-dimensional electron gas can be present for reading out the memory cell. Such a read-out layer is preferably separated from the semiconductor heterostructure by a semiconductor interlayer. The thickness of the semiconductor interlayer is dimensioned for example in such a way that the read-out layer lies at the edge of or outside the space charge zone in the storage state. The thickness of the semiconductor interlayer is preferably at least 5 nm.

The semiconductor heterostructure is particularly preferably formed by a carrier layer in which a plurality of nanostructures are arranged at a distance from one another. The layer material of the carrier layer preferably has a higher electrical resistance than the read-out layer. By virtue of the fact that the nanostructures are arranged at a distance from one another, it is possible for connection contacts for making the electrical contact with the read-out layer to be led through the semiconductor heterostructure without further insulation layers and without a direct short circuit between the nanostructures being able to occur.

With regard to a particularly high information density, it is regarded as advantageous if the semiconductor heterostructure has a plurality of occupation states which each represent an item of bit information and can be occupied by charge carriers, and that the number of occupied occupation states can be read out. Charge carrier multiplexing and thus multi-level cells can be realized in this way.

By way of example, an evaluation device can be connected to the memory cell, which evaluation device measures the charged state of the at least one potential well and, with the measured value, determines a number indicating the item of bit information.

By way of example, the evaluation device can output a binary number as bit information.

Preferably, the semiconductor heterostructure and the space charge zone are spatially arranged relative to one another in such a way that a voltage of zero volts between the electrical connections of the memory cell represents or effects a maintaining voltage.

The invention additionally relates to a method for operating a memory cell, in which an item of bit information of the memory cell is defined by the charged state of at least one potential well of the memory cell, wherein the charged state of the potential well with charge carriers is increased by applying an electrical supply voltage to the memory cell, and is reduced by applying a discharge voltage, and wherein the charge carriers remain trapped within the potential well upon application of a maintaining voltage. Such a method is known from the flash memory cells mentioned in the introduction.

With regard to a fast access time and a long storage time, according to the invention it is proposed that for increasing the charged state, a supply voltage is applied to the memory cell which is such that a semiconductor heterostructure forming the potential well is situated at the edge of or outside a space charge zone of the memory cell, that for maintaining the charged state, a maintaining voltage is applied to the memory cell which is such that the semiconductor heterostructure is situated within said space charge zone, and the charge carriers are trapped within the semiconductor heterostructure, and that, for reducing the charged state, a discharge voltage is applied to the memory cell which is such that the semiconductor heterostructure is situated within said space charge zone, but the charge carriers can leave the heterostructure.

With regard to the advantages of the method according to the invention, reference should be made to the above explanations in connection with the memory cell according to the invention, since the advantages of the memory cell according to the invention essentially correspond to those of the method according to the invention. The same correspondingly holds true for advantageous developments of the method according to the invention.

Preferably, the maintaining voltage is applied to the memory cell during the read-out of the memory cell. The read-out can be carried out for example by evaluating an electrical resistance of a read-out layer containing a two-dimensional electron gas, said resistance being dependent on the charged state of the potential well. As an alternative, the read-out can be carried out by evaluating the capacitance of the space charge zone of the memory cell, said capacitance being dependent on the charged state of the potential well. The read-out can also be carried out by evaluating the electrical resistance of the memory cell, said resistance being dependent on the charged state of the potential well. It is likewise possible to carry out the read-out by evaluating the charge transfer from or to the memory cell, said charge transfer being dependent on the charged state of the potential well.

As an alternative, the discharge voltage can be applied to the memory cell during the read-out of the memory cell. In this case, too, the read-out can be carried out by evaluating the charge transfer from or to the memory cell, said charge transfer being dependent on the charged state of the potential well.

For increasing the charged state of the potential well, preferably a supply voltage is applied to the memory cell which is such that the charge carriers relax into the potential well from a conduction or valence band edge of a doped semiconductor material that is indirectly or directly adjacent to the potential well.

For reducing the charged state of the potential well, preferably a discharge voltage is applied to the memory cell which is such that the charge carriers tunnel out of the potential well.

Figure 2:
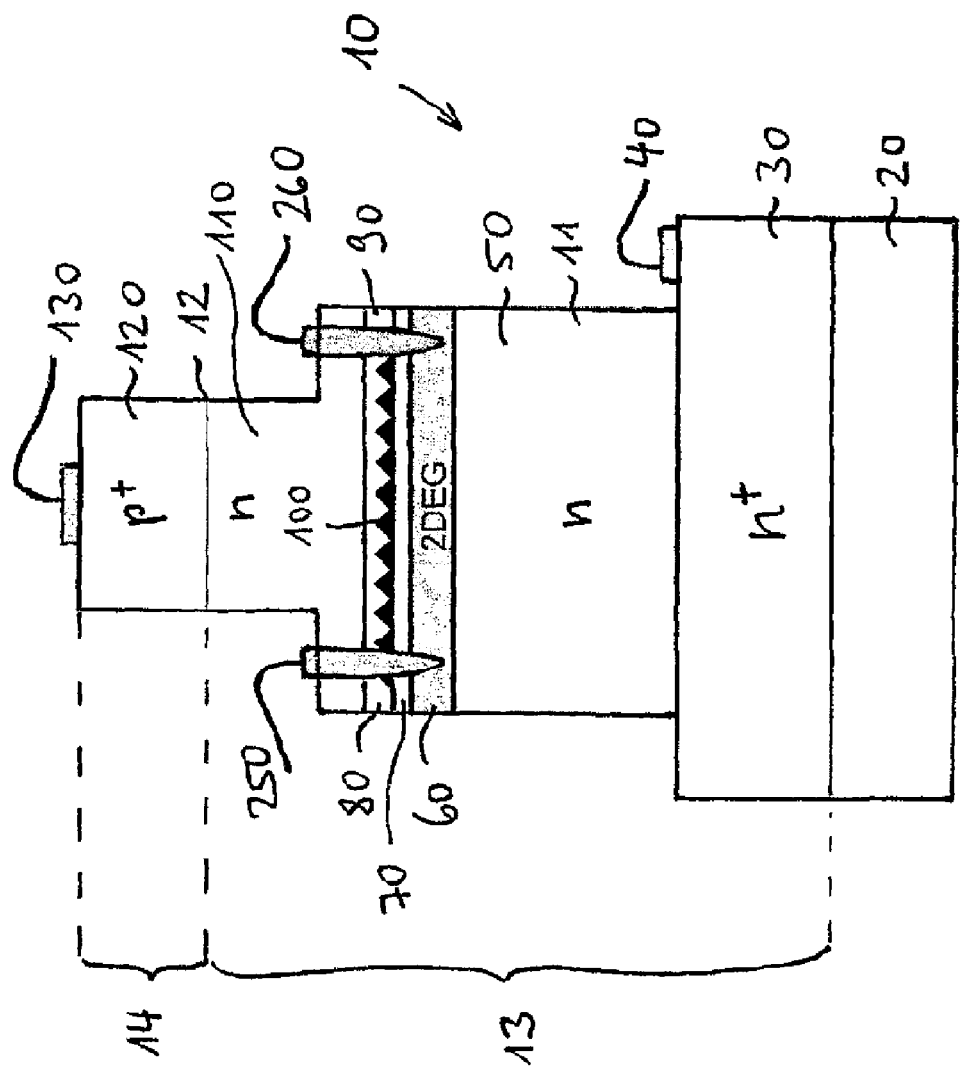
Figure 3:
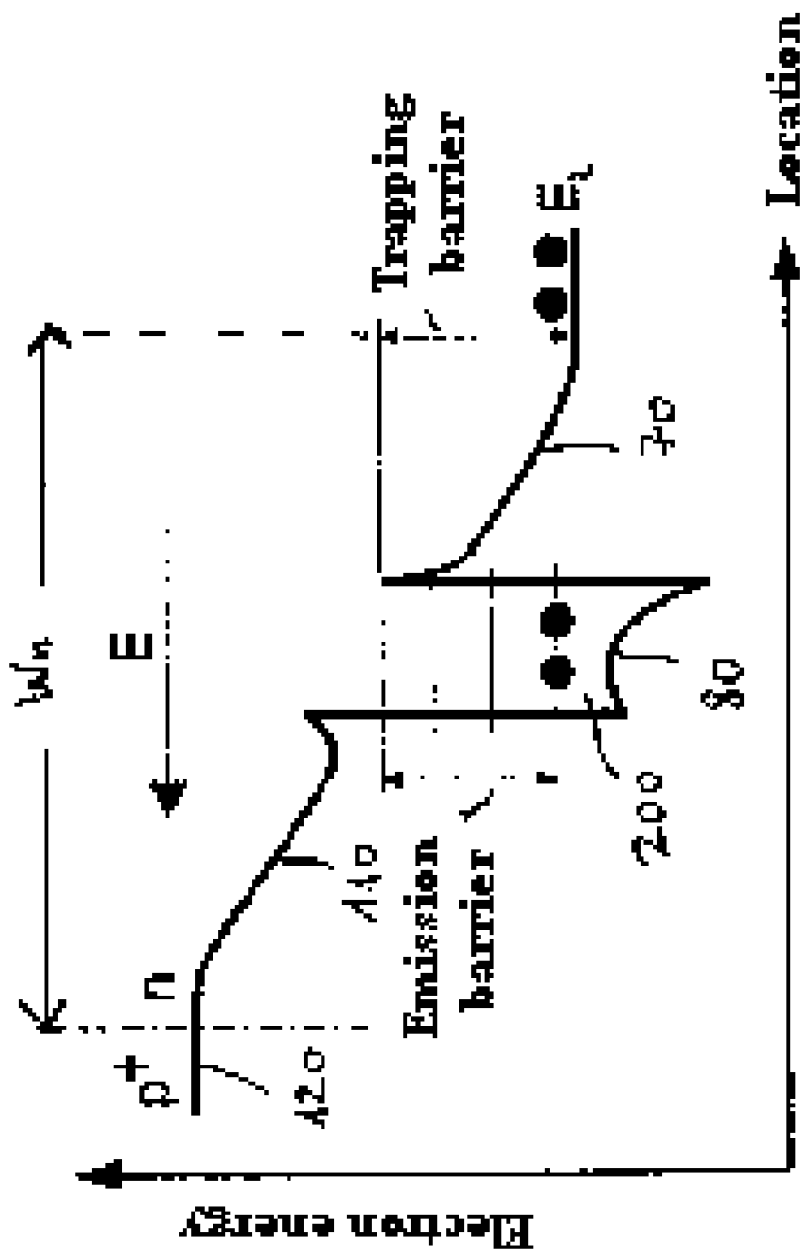
Figure 4:
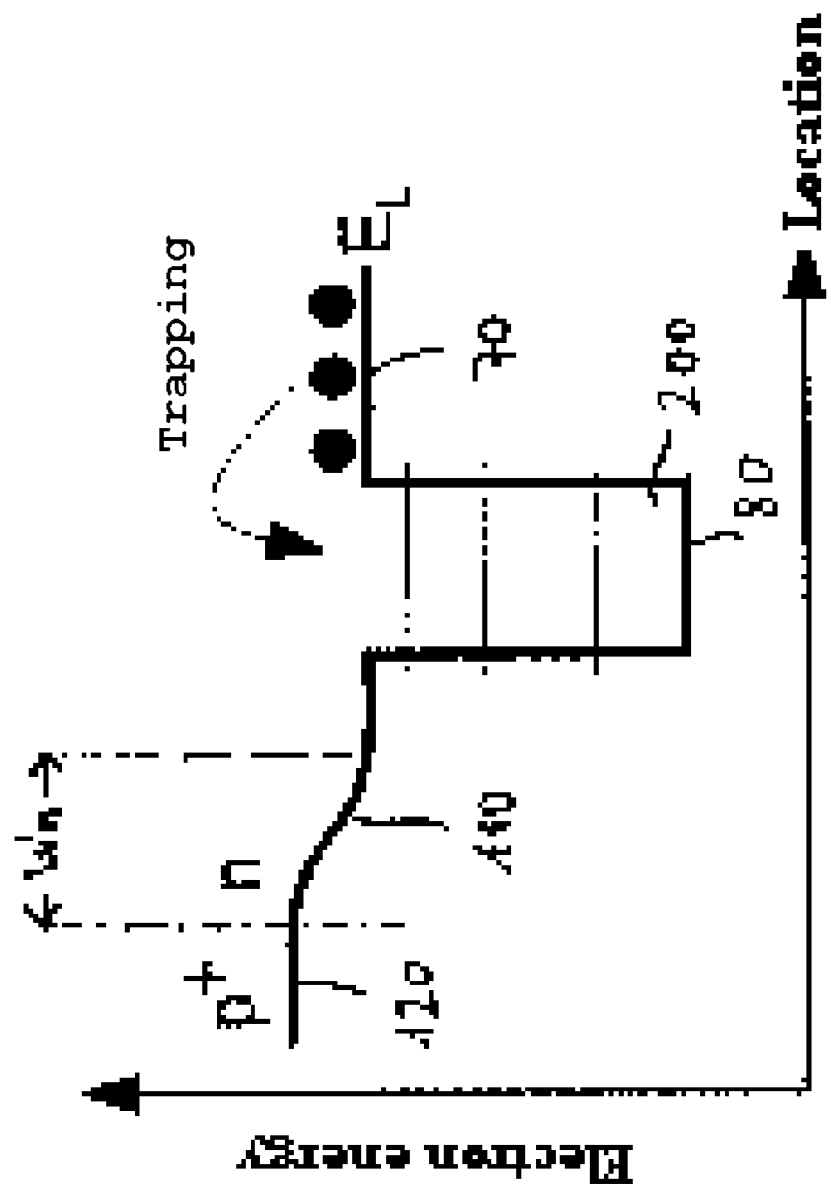
Figure 5:
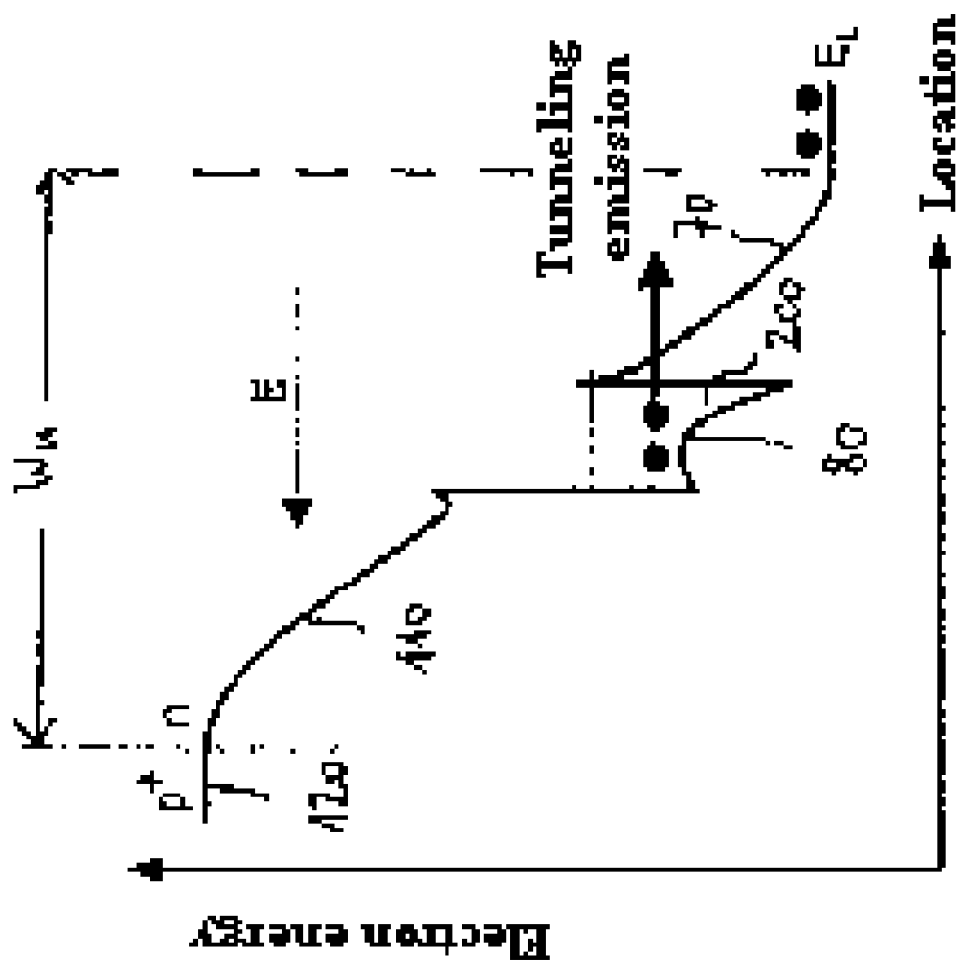
Figure 6:
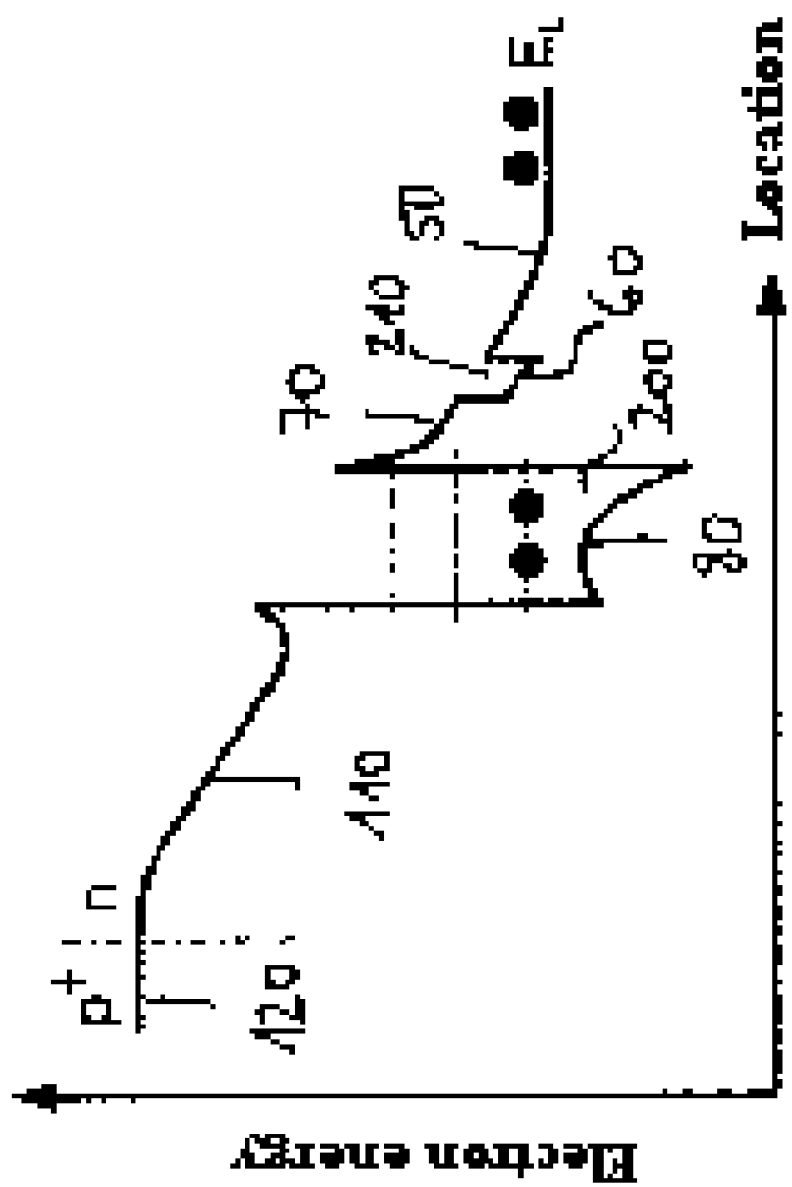
Figure 7:
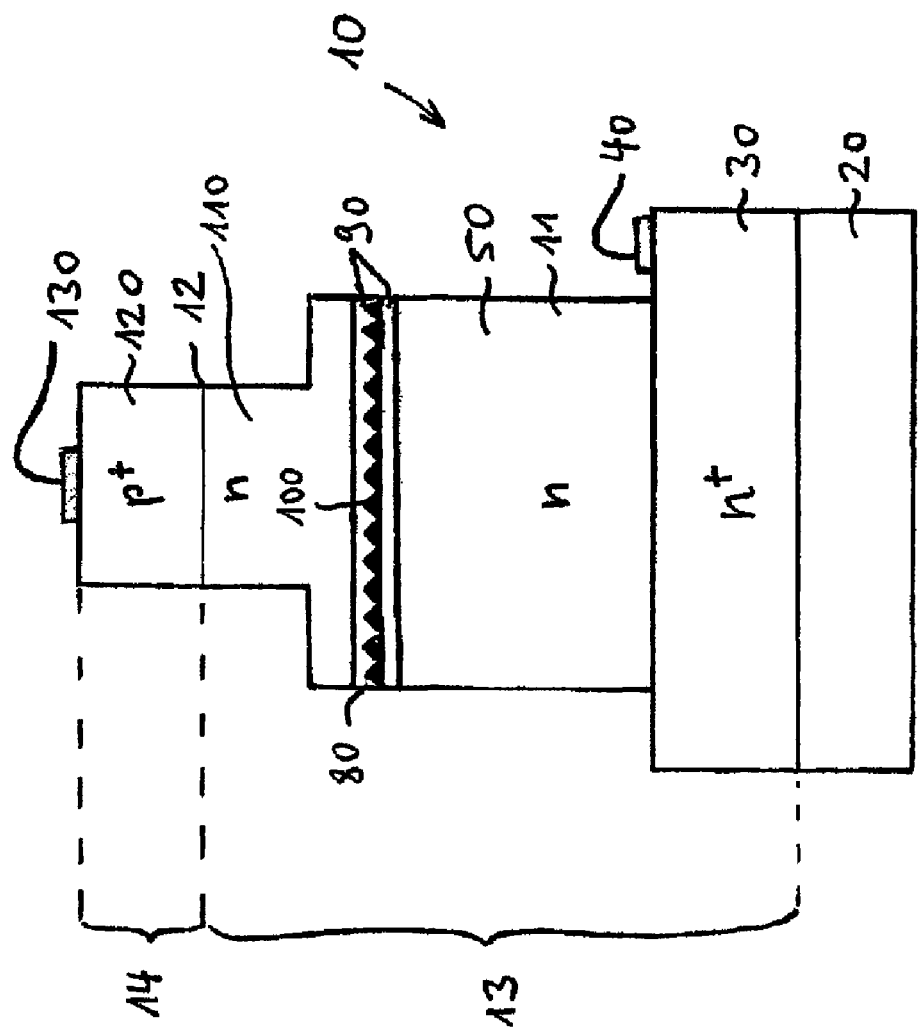
Figure 8:
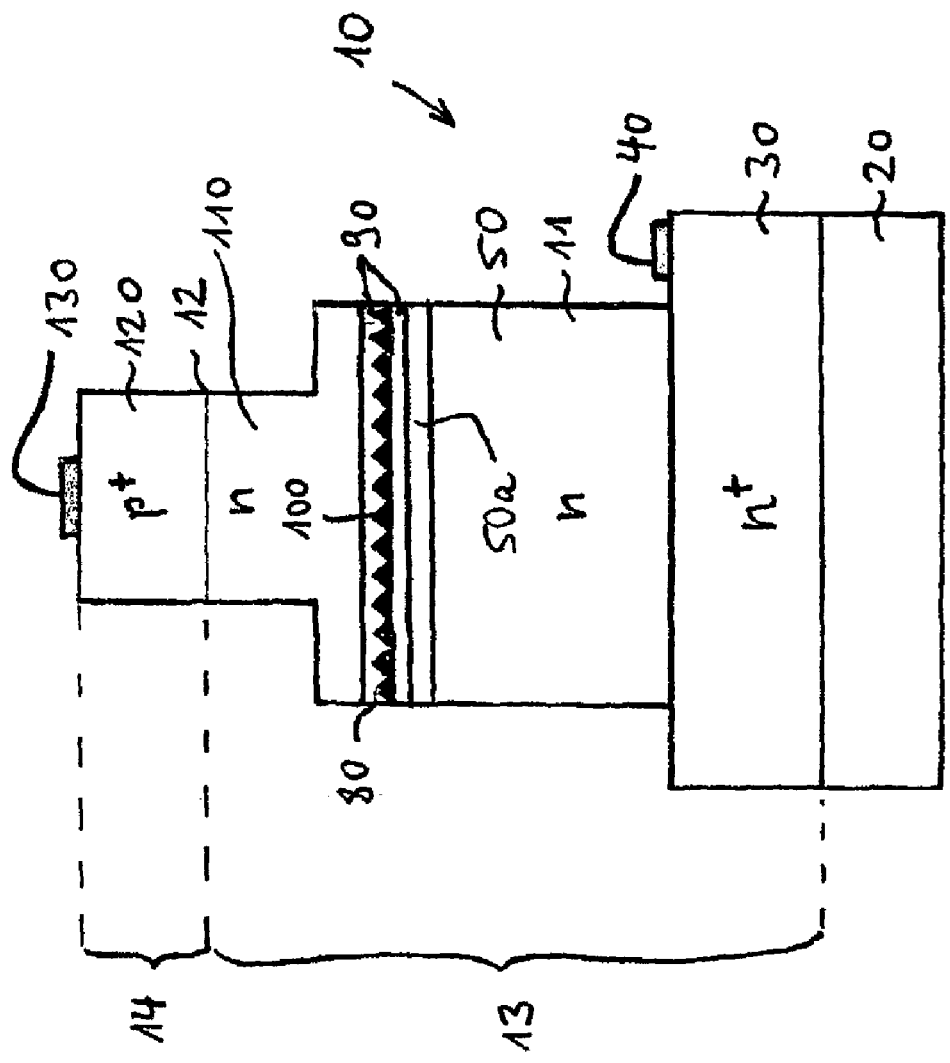
Figure 9:
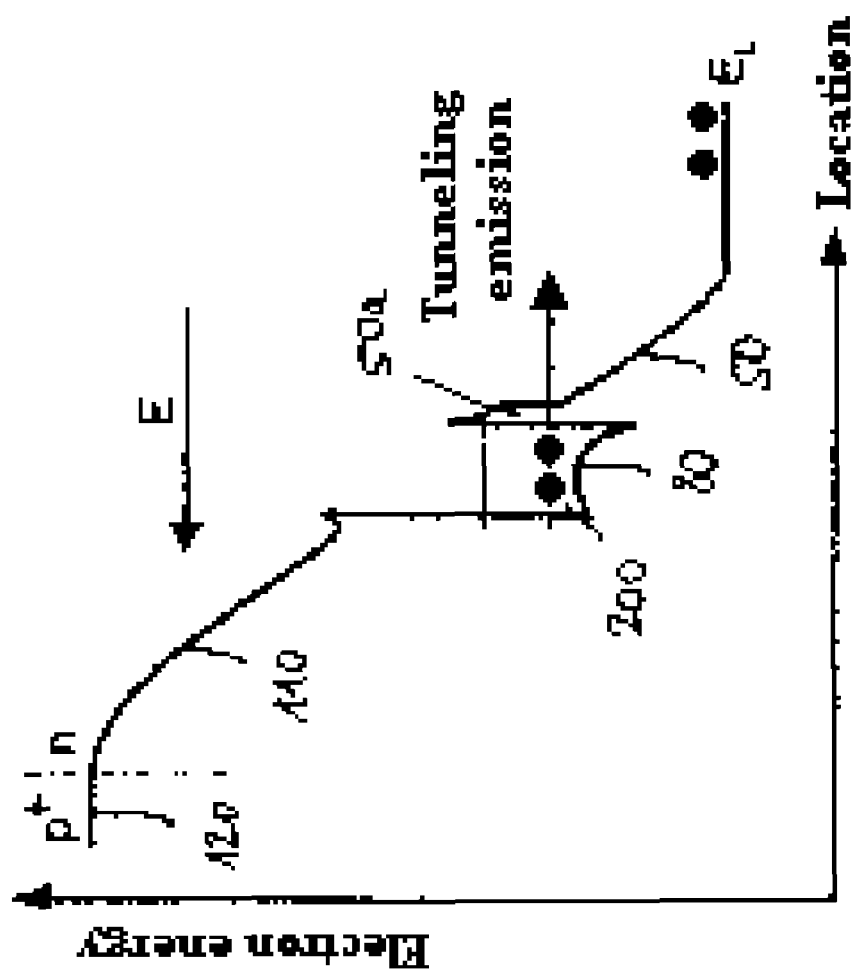
Figure 10:
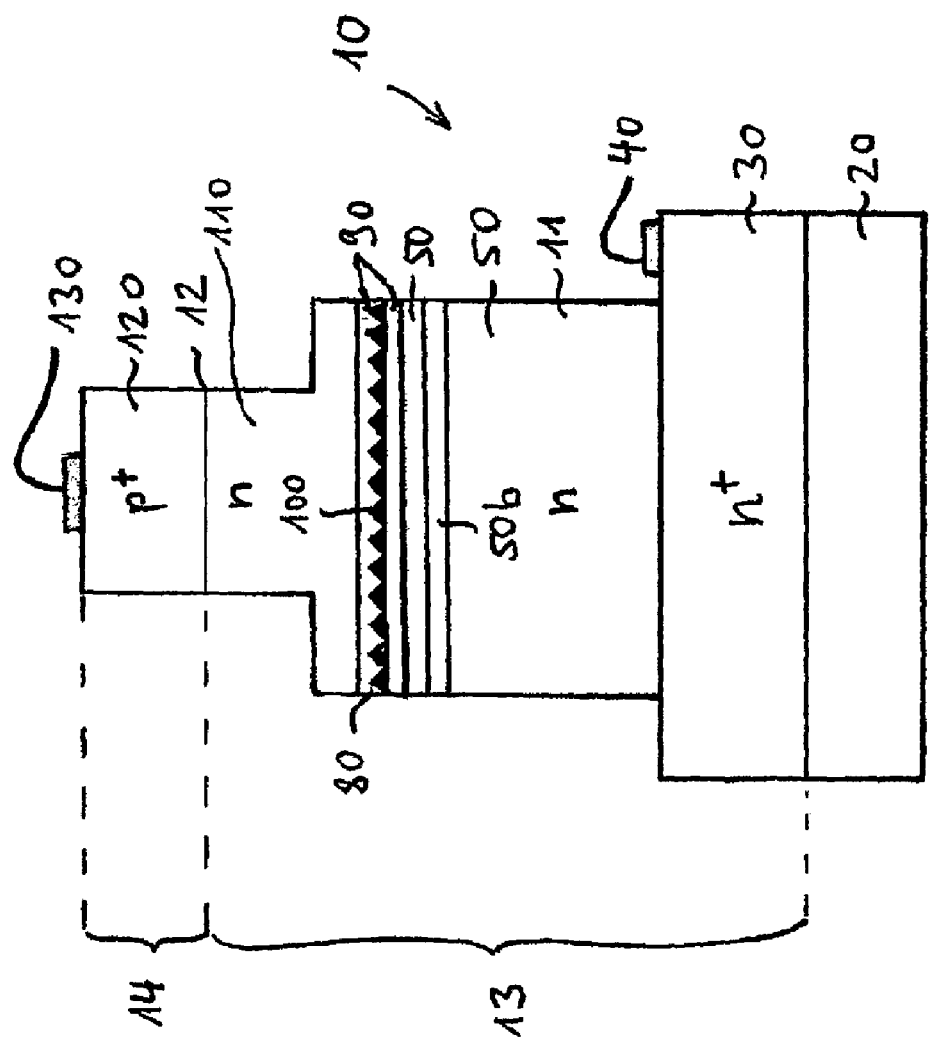
Figure 11:
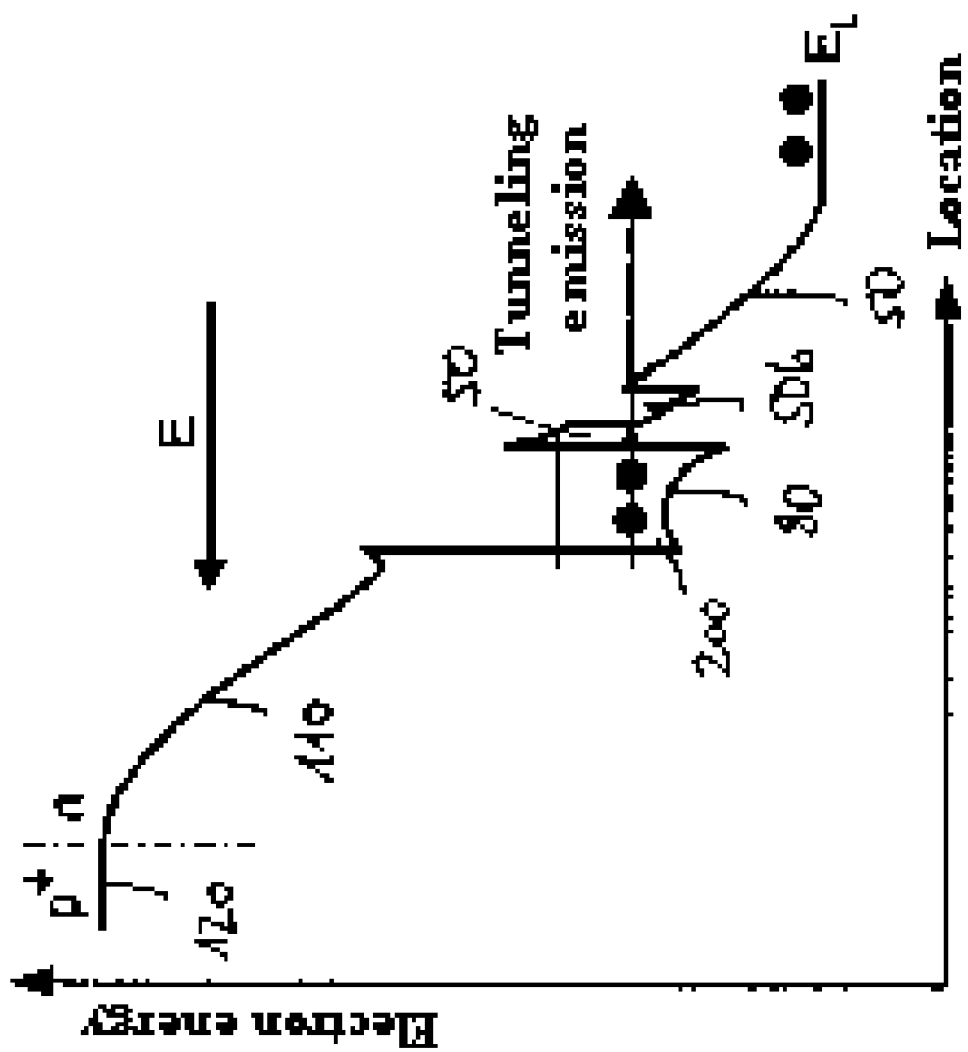
Figure 12:
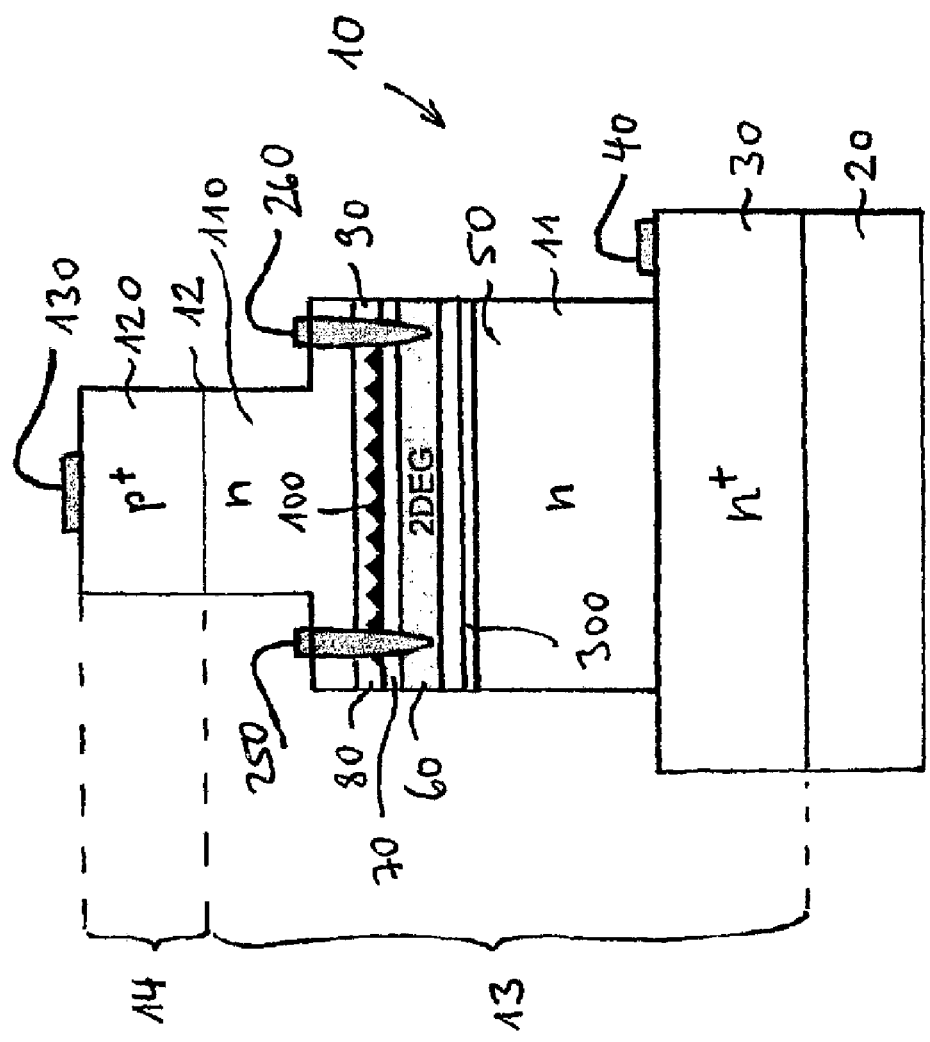
Figure 13:
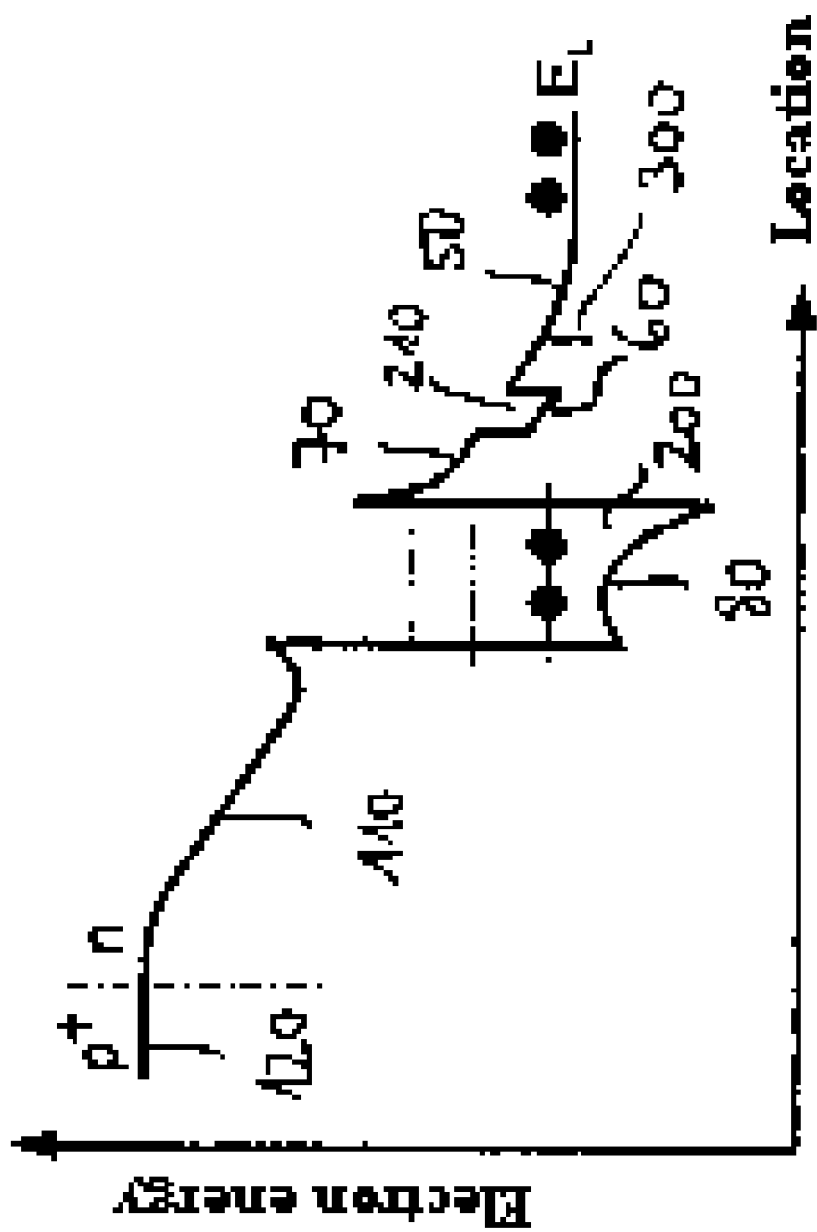
Figure 14:
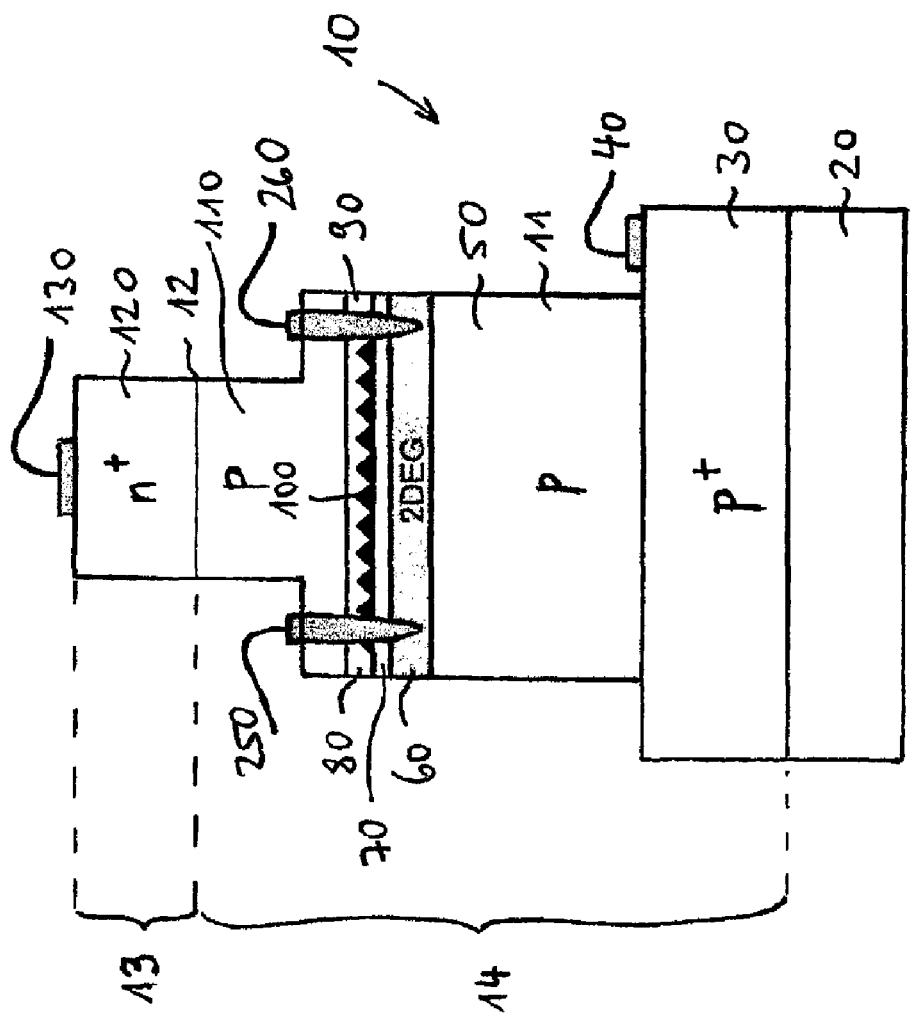

The invention is explained in more detail below on the basis of exemplary embodiments; in this case, by way of example, FIGS. 1-2 show a first exemplary embodiment of a memory cell according to the invention with one nanostructure (for example a quantum film), which forms one potential well, or a plurality of nanostructures (for example quantum dots) forming a plurality of potential wells, and also with a read-out layer, FIGS. 3-5 show the band profile within the memory cell in accordance with FIG. 1 in the case of maintaining the filling state of the potential well, in the case of filling the potential well and in the case of emptying the potential well, FIG. 6 shows the influence of the read-out layer on the band profile, FIG. 7 shows a second exemplary embodiment of a memory cell according to the invention with nanostructures, but without a read-out layer, FIGS. 8-9 show a third exemplary embodiment of a memory cell according to the invention without a read-out layer, but with an additional auxiliary layer for an improved tunneling behavior in the case of emptying the potential well, FIGS. 10-11 show a fourth exemplary embodiment of a memory cell according to the invention with an additional quantum film layer for an improved tunneling behavior in the case of emptying the potential well, FIGS. 12-13 show a fifth exemplary embodiment of a memory cell 10 with an additional layer doped in delta-type fashion, FIG. 14 shows a sixth exemplary embodiment with an inverse doping profile with respect to exemplary embodiments 1-5, and FIG. 15 shows a flash memory cell according to the prior art for general elucidation purposes.

In FIGS. 1-14, the same reference symbols are used for identical or comparable components, for the sake of clarity.

FIG. 1 illustrates a first exemplary embodiment of a memory cell 10 in a three-dimensional view obliquely from above. FIG. 2 shows the corresponding memory cell 10 in cross section.

As will be explained in detail further below, the memory cell 10 contains a semiconductor structure 11 with a pn junction 12, which provides a space charge zone. In the exemplary embodiment described below it is assumed that the layers forming the pn junction 12 are arranged in such a way that n-doped memory cell material 13 lies below the p-doped memory cell material 14; it goes without saying that this arrangement should be understood merely by way of example: thus, the n-doped memory cell material 13 can instead also be arranged above the p-doped memory cell material 14.

Both FIGS. 1 and 2 reveal a substrate 20, on which a highly n-doped connection layer 30 is applied. A bottom electrical connection 40 of the memory cell 10 is situated on the connection layer 30. By way of example, the substrate 20 comprises undoped GaAs, and the highly n-doped connection layer 30 comprises $Al_xGa_{1-x}As$.

An n-doped lead layer 50 bears on the connection layer 30, a read-out layer 60 being arranged above said lead layer; the read-out layer 60 comprises $In_xGa_{1-x}As$, for example, and provides a two-dimensional electron gas, which is identified by the reference symbol 2DEG in FIG. 2. The n-doped lead layer 50 comprises $Al_xGa_{1-x}As$ for example.

A semiconductor heterostructure 80 is provided in a manner separated from the read-out layer 60 by a semiconductor interlayer 70 composed for example of the same material as the lead layer 50, said semiconductor heterostructure being formed by a carrier layer 90 with nanostructures 100, for example in the form of quantum dots, embedded in said carrier layer. The band gap of the semiconductor heterostructure 80 is smaller than that in the underlying layer 70 and likewise smaller than in an n-doped spacer layer 110 situated above said heterostructure, such that the semiconductor heterostructure 80 provides at least one potential well in which charge carriers can be trapped.

By way of example, the carrier layer 90 comprises doped or undoped $Al_xGa_{1-x}As$, and the nanostructures are preferably formed from $In_xGa_{1-x}Sb$ or $In_xGa_{1-x}As$. The n-doped spacer layer 110 can comprise the same material as the n-doped lead layer 50, for example.

A highly p-doped connection layer 120 composed for example of the same material as the spacer layer 110 is situated on the n-doped spacer layer 110, a top electrical connection 130 of the memory cell 10 bearing on said connection layer.

The pn junction 12 is formed by the junction point between the highly p-doped connection layer 120 and the n-doped spacer layer 110. The pn junction 12 brings about a space charge zone in the memory cell 10, the space charge zone width of which is dependent on the control voltage Us applied to the two electrical connections 40 and 130 and the doping concentration in the layers 110 and 50.

FIG. 3 shows the band profile in the memory cell 10 for the case where, as control voltage Us, no voltage or a maintaining voltage is applied, in the case of which the charged state of the memory cell 10 is maintained or kept constant. For reasons of clarity, FIG. 3 only illustrates the conduction band $E_L$ and electrons as charge carriers; however, the explanations below correspondingly hold true for the valence band and for holes as charge carriers, depending on the embodiment of the semiconductor structure 11.

It can be discerned in FIG. 3 that the doping of the layers of the memory cell 10 and the thickness of the spacer layer 110 are chosen such that the space charge zone extends right into the semiconductor heterostructure 80 and encloses the latter when the maintaining voltage is present (that is to say, for example, when Us=Umaint=0V); the space charge zone width Wn within the n-doped memory cell material 13 is thus greater than, at least exactly equal to, the thickness of the layer assembly composed of the spacer layer 110 and the thickness of the semiconductor heterolayer 80.

In FIG. 3 it can furthermore be discerned that the charge carriers situated within the potential well 200 formed by the semiconductor heterostructure 80 cannot leave said potential well since they cannot surmount the emission barrier. It should be mentioned in this connection that the height of the emission barrier crucially determines the storage time of the memory cell 10 and should therefore be as large as possible; it is preferably at least 1.0 eV in order to realize a storage time of several days.

On account of the spatial position of the potential well 200 within the space charge zone Wn, it is additionally ensured that no additional charge carriers can undesirably fall into the potential well 200 and alter or overwrite the storage state in this way; this is because the space charge zone is very low in free charge carriers, such that there are simply no charge carriers available for corrupting the memory content. It is likewise not possible for any charge carriers to penetrate into the potential well 200 from outside the space charge zone Wn, since they cannot surmount the trapping barrier formed by the band profile within the space charge zone.

FIG. 4 illustrates how the potential well 200 can be filled with charge carriers in order for example to write a logic "one" to the memory cell 10. It is assumed hereinafter by way of example that a logic one is characterized by a filled potential well 200 and a logic zero is characterized by an empty potential well; it goes without saying that this definition is arbitrary and could also be reversed.

For "writing" a logic one, as control voltage Us a supply voltage Usupply, to be precise a forward voltage Usupply>Umin (Umin is 0.7 V for example), is applied to the two connections 40 and 130 and thus to the pn junction 12, with the result that the space charge zone Wn is reduced. It can be discerned in FIG. 4 that the space charge zone width Wn no longer projects into the semiconductor heterostructure 80 and the trapping barrier has been completely reduced. Consequently, the charge carriers, electrons in the present case, can "fall" directly into the potential well 200 from the conduction band edge $E_L$ in the context of a relaxation process. The potential well 200 is filled very rapidly, with the result that writing times for writing the state "filled with charge carriers" (or bit information "one") in picoseconds are possible.

FIG. 5 illustrates how the potential well can be emptied of the charge carriers in order for example to write a logic "zero" to the memory cell 10. For "emptying" (writing a logic zero), a reverse voltage Us=Urev (Urev is −15 V for example) is applied as a discharge voltage to the two connections 40 and 130 and thus to the pn junction 12, with the result that the space charge zone Wn is increased. At the same time the band profile is altered or distorted, such that a tunneling emission of the electrons trapped in the potential well 200 becomes possible. The electrons can thus leave the potential well 200, whereby the latter is emptied and a logic zero is written to the memory cell.

Although the tunneling process is somewhat slower than the relaxation process in the case of filling the potential well 200, emptying times or writing times for a logic zero in the nanoseconds range are nevertheless possible.

An explanation will now be given, in connection with FIGS. 1, 2 and 6, of how the memory cell 10 can be read without the memory cell content being altered. The read-out layer 60 is used for this purpose, the band profile of this layer being illustrated in FIG. 6. It can be discerned that the band gap is smaller in the read-out layer 60 than in the adjacent layers, that is to say the semiconductor interlayer 70 and the n-doped lead layer 50, with the result that the two-dimensional electron gas already mentioned can form in the further potential well 210.

Contact is made with the read-out layer 60 by means of two lateral connection contacts 250 and 260 (FIGS. 1 and 2), such that the electrical properties of the read-out layer 60 can be measured by a measuring device 270. Owing to the proximity of the read-out layer 60 to the semiconductor heterostructure 80, the electrical properties of the read-out layer 60 are dependent on the filling state or the charging of the potential well 200 in the semiconductor heterostructure 80, such that by measuring the electrical properties of the read-out layer 60, it is possible to measure the filling state of the potential well 200 and to determine the storage state of the memory cell 10 without there being the risk of the storage state of the memory cell 10 thereby being altered.

By way of example, the charged state of the potential well 200 can be determined by measuring and evaluating the electrical resistance of the read-out layer 60, said resistance being dependent on said charged state.

FIG. 7 shows a second exemplary embodiment of a memory cell 10. In contrast to the exemplary embodiment in accordance with FIGS. 1 to 6, the semiconductor interlayer 70 and the read-out layer 60 are absent, with the result that the semiconductor heterostructure 80 is directly adjacent to the n-doped lead layer 50.

While the writing of logic ones and zeros can proceed in exactly the same way as was explained in connection with FIGS. 1 to 6, the read-out process has to be carried out differently, however, since the read-out layer 60 is absent.

By way of example, the read-out is carried out by evaluating the capacitance of the space charge zone Wn of the memory cell 10, said capacitance being dependent on the charged state of the potential well. As an alternative, the read-out can be carried out by evaluating the electrical resistance of the memory cell 10, said resistance being dependent on the charged state of the potential well.

The read-out can also be carried out by evaluating the charge transfer from or to the memory cell 10, said charge transfer being dependent on the charged state of the potential well 200. The last-mentioned method can be carried out both when the discharge voltage provided for writing a zero or for discharging is present and when the maintaining voltage is present at the memory cell.

FIGS. 8 and 9 show a third exemplary embodiment of a memory cell 10. In this exemplary embodiment—compared with the second exemplary embodiment in accordance with FIG. 7—an auxiliary layer 50a is additionally present, which separates the n-doped lead layer 50 from the semiconductor heterostructure 80. The n-doped lead layer 50 has a smaller band gap than the auxiliary layer 50a, such that a "tunneling" of the charge carriers out of the potential well 200 in the case of emptying the semiconductor heterostructure 80 is simplified and thus accelerated. On account of the auxiliary layer 50a, therefore, the writing of a "zero" is possible more rapidly than without said layer. The associated band structure is shown in FIG. 9.

The layers 50a and 110 can comprise for example the same material, for example AlAs; the layer 50 comprises 50-percent strength $Al_{0.5}Ga_{0.5}As$, for example. The resulting energetic height of the emission barrier between the semiconductor heterostructure 80 (e.g. composed of GaSb or InSb) and the AlAs barrier 50a would in this case be for example approximately 1 eV or 1.2 eV, resulting in a storage time of days or years at room temperature. On account of this layer arrangement, a trapping barrier also additionally arises during the writing process, but the energetic height of said trapping barrier is far short of that in a flash memory according to the prior art.

FIGS. 10 and 11 show a fourth exemplary embodiment of a memory cell 10. In this exemplary embodiment—compared with the second exemplary embodiment in accordance with FIG. 7—a quantum film layer 50b is additionally present which is embedded within the n-doped lead layer 50. The quantum film layer 50b has a smaller band gap than the n-doped lead layer 50. The quantum film layer 50b can be $In_xGa_{1-x}As$, for example, which is embedded in a lead layer 50 composed of $Al_xGa_{1-x}As$ matrix material. The layer thickness is approximately 1-5 nm, for example; it enables the erasing speed to be increased since discrete energy levels form within the quantum film layer 50b, which energy levels, in the case of a corresponding discharge voltage, enable a resonant tunneling from the semiconductor heterostructure 80. This means that the charge carriers can tunnel into the conduction or valence band of the lead layer 50 more simply via the states in the quantum film layer 50b than without this layer.

FIGS. 12 and 13 show a fifth exemplary embodiment of a memory cell 10. In contrast to the exemplary embodiment in accordance with FIGS. 1 to 11, an additional layer 300 doped in delta-type fashion is present, which layer is arranged within the n-doped lead layer 50 and has a higher doping than the lead layer 50. The thickness of the layer 300 doped in delta-type fashion is preferably one monolayer. The function of the layer 300 doped in delta-type fashion is to make available, in addition to the lead layer 50, charge carriers for the formation of the two-dimensional electron gas 2DEG in the read-out layer 60.

FIG. 14 shows a sixth exemplary embodiment of a memory cell 10. In contrast to the exemplary embodiments in accordance with FIGS. 1 to 13, in this fifth exemplary embodiment the layers are arranged in such a way that n-doped memory cell material 13 lies above the p-doped memory cell material 14.

To summarize, it should be mentioned that, in principle, it is possible to use all types of semiconductor materials or semiconductor structures which can be used to form semiconductor heterostructures with potential wells. However, the following material combinations are particularly suitable:

For an $Al_{0.43}Ga_{0.57}As$ carrier layer 90, an n-doped lead layer 50, an n-doped spacer layer 110 and InAs as material for the nanostructures 100, this results in an emission barrier height of approximately at least 0.7 eV and thus storage times at room temperature of several milliseconds.

For an AlAs carrier layer 90, a p-doped lead layer 50, a p-doped spacer layer 110 and InAs as material for the nanostructures 100, this results in an emission barrier height of at least 0.75 eV and thus storage times of several milliseconds at room temperature.

For an AlAs carrier layer 90, a p-doped lead layer 50, a p-doped spacer layer 110 and GaSb as material for the nanostructures 100, this results in an emission barrier height of at least 1 eV and thus storage times of several days at room temperature.

For an AlAs carrier layer 90, a p-doped lead layer 50, a p-doped spacer layer 110 and InSb as material for the nanostructures 100, this results in an emission barrier height of at least 1.2 eV and thus storage times of several years at room temperature.

It should also be mentioned that the semiconductor heterostructure 80 can have a plurality of occupation states, as is indicated in FIG. 3 by parallel lines within the potential well 80. Each occupation state can respectively represent an item of bit information by virtue of its being occupied by charge carriers or remaining free thereof. It is thereby possible, with an evaluation device connected to the memory cell, to measure the charged state of the potential well and, with the respective measured value, to determine the bit information defined by the charged state for example in the form of a number.

LIST OF REFERENCE SYMBOLS

10 Memory cell
11 Semiconductor structure
12 pn junction
13 n-doped memory cell material
14 p-doped memory cell material
20 Substrate
30 Highly n-doped connection layer
40 Bottom electrical connection
50 n-doped lead layer
50a Auxiliary layer
50b Quantum film layer
60 Read-out layer
70 Semiconductor interlayer
80 Semiconductor heterostructure
90 Carrier layer
100 Nanostructures
110 n-doped spacer layer
120 Highly p-doped connection layer
130 Top electrical connection
200 Potential well
210 Further potential well
250, 260 Lateral connection contacts
300 Layer doped in delta-type fashion
Us Control voltage
Wn Space charge zone width

The invention claimed is:

1. A memory cell for storing at least one item of bit information, wherein the memory cell comprises a semiconductor structure with a band profile having at least one potential well and comprises at least two electrical connections,
  wherein the charged state of the potential well with charge carriers can be increased by applying an electrical supply voltage to the two connections, can be reduced by applying a discharge voltage, and can be maintained by applying a maintaining voltage,
  wherein the respective charged state of the potential well defines the item of bit information of the memory cell,
  wherein the semiconductor structure has a space charge zone,
  wherein the potential well is formed by a semiconductor heterostructure, and
  wherein the semiconductor heterostructure and the space charge zone are spatially arranged relative to one another in such a way that the semiconductor heterostructure is situated within the space charge zone when the maintaining voltage is present, at the edge of or outside the space charge zone when the supply voltage is present, and within the space charge zone when the discharge voltage is present.

2. The memory cell as claimed in claim 1, wherein the semiconductor heterostructure has at least one nanostructure.

3. The memory cell as claimed in claim 1, wherein the space charge zone is brought about by a pn junction.

4. The memory cell as claimed in claim 1, wherein the charged state of the semiconductor heterostructure can be increased by applying a forward voltage to the connections, and
  wherein the charged state is increased by relaxation of the charge carriers from a conduction or valence band edge of a doped semiconductor material that is indirectly or directly adjacent to the semiconductor heterostructure.

5. The memory cell as claimed in claim 1, wherein the band profile is embodied in the region of the semiconductor heterostructure in such a way that the charged state of the semiconductor heterostructure can be reduced by applying a reverse voltage to the connections, and
  wherein the reduction of the charged state is based on a tunnel effect by means of which the charge carriers leave the semiconductor heterostructure.

6. The memory cell as claimed in claim 1, wherein the semiconductor structure comprises a III/V material combination, a II/VI material combination or a IV/IV material combination.

7. The memory cell as claimed in claim 1, wherein a read-out layer containing a two-dimensional electron gas is present, which enables the item of bit information of the memory cell to be read out.

8. The memory cell as claimed in claim 7, wherein the read-out layer is separated from the semiconductor heterostructure by a semiconductor interlayer.

9. The memory cell as claimed in claim 8, wherein the thickness of the semiconductor interlayer is dimensioned in such a way that the read-out layer lies at the edge of or outside the space charge zone in the storage state, and wherein the thickness of the semiconductor interlayer is at least 5 nm.

10. The memory cell as claimed in claim 1, wherein the semiconductor heterostructure is formed by a carrier layer in which a plurality of nanostructures are arranged at a distance from one another, and wherein the layer material of the carrier layer has a higher electrical resistance than the read-out layer.

11. The memory cell as claimed in claim 10, wherein connection contacts for making electrical contact with the read-out layer are led through the semiconductor hetero structure.

12. The memory cell as claimed in claim 1, wherein the semiconductor heterostructure has a plurality of occupation states which each represent an item of bit information by virtue of the fact that they can be occupied by charge carriers, and wherein the number of occupied occupation states can be read out.

13. A memory device having at least one memory cell as claimed in claim 1, wherein an evaluation device is connected to the memory cell, which evaluation device measures the charged state of the at least one potential well and, with the measured value, determines a number indicating the item of bit information.

14. The memory device as claimed in claim 13, wherein the evaluation device outputs a binary number as bit information.

15. A method for operating a memory cell, in which an item of bit information of the memory cell is defined by the charged state of at least one potential well of the memory cell,
wherein the charged state of the potential well with charge carriers is increased by applying an electrical supply voltage to the memory cell, and is reduced by applying a discharge voltage,
wherein the charge carriers remain trapped within the potential well upon application of a maintaining voltage,
wherein for increasing the charged state, a supply voltage is applied to the memory cell which is such that a semiconductor heterostructure forming the potential well is situated at the edge of or outside a space charge zone of the memory cell,
wherein, for maintaining the charged state, a maintaining voltage is applied to the memory cell which is such that the semiconductor heterostructure is situated within said space charge zone, and
wherein, for reducing the charged state, a discharge voltage is applied to the memory cell which is such that the semiconductor heterostructure is situated within said space charge zone, but the charge carriers can leave the heterostructure.

16. The method as claimed in claim 15, wherein the read-out is carried out by reading a read-out layer containing a two-dimensional electron gas or a two-dimensional hole gas, by evaluating the electrical resistance of said read-out layer, said electrical resistance being dependent on the charged state of the potential well.

17. The method as claimed in claim 15, wherein the read-out is carried out by evaluating the capacitance of the space charge zone of the memory cell, said capacitance being dependent on the charged state of the potential well, or
wherein the read-out is carried out by evaluating the electrical resistance of the memory cell, said electrical resistance being dependent on the charged state of the potential well, or
wherein the read-out is carried out by evaluating the charge transfer from or to the memory cell, said charge transfer being dependent on the charged state of the potential well.

18. The method as claimed in claim 15, wherein the discharge voltage is applied to the memory cell during the read-out of the memory cell, and wherein the read-out is carried out by evaluating the charge transfer from or to the memory cell, said charge transfer being dependent on the charged state of the potential well.

19. The method as claimed in claim 15, wherein, for increasing the charged state of the potential well, a supply voltage is applied to the memory cell which is such that the charge carriers relax into the potential well from a conduction or valence band edge of a doped semiconductor material that is indirectly or directly adjacent to the potential well.

20. The method as claimed in claim 15, wherein, for reducing the charged state of the potential well, a discharge voltage is applied to the memory cell which is such that the charge carriers tunnel out of the potential well.

* * * * *